United States Patent [19]
Angerstein et al.

[11] Patent Number: 4,613,884
[45] Date of Patent: Sep. 23, 1986

[54] LIGHT CONTROLLED TRIAC WITH LATERAL THYRISTOR FIRING COMPLEMENTARY MAIN THYRISTOR SECTION

[75] Inventors: Jörg Angerstein, Flein; Dieter Silber, Obertshausen, both of Fed. Rep. of Germany

[73] Assignees: Licentia Patent-Verwaltungs GmbH, Frankfurt; Telefunken Electronic GmbH, Heilbronn, both of Fed. Rep. of Germany

[21] Appl. No.: 547,095

[22] Filed: Oct. 31, 1983

[30] Foreign Application Priority Data

Nov. 3, 1982 [DE] Fed. Rep. of Germany ....... 3240564

[51] Int. Cl.⁴ .......................................... H01L 29/747
[52] U.S. Cl. ...................................... 357/39; 357/30; 357/35; 357/86
[58] Field of Search ...................... 357/35, 38, 39, 30, 357/86

[56] References Cited

U.S. PATENT DOCUMENTS

| | | | |
|---|---|---|---|
| 3,508,127 | 4/1970 | Bergman et al. | 357/39 |
| 3,524,114 | 8/1970 | Hutson . | |
| 3,586,928 | 6/1971 | Bergman et al. | 357/38 |
| 3,699,406 | 10/1972 | Mapother et al. . | |
| 3,832,732 | 8/1974 | Roberts | 357/39 |
| 4,087,834 | 5/1978 | Temple . | |
| 4,224,634 | 9/1980 | Suedberg | 357/39 |

FOREIGN PATENT DOCUMENTS

| | | |
|---|---|---|
| 0021086 | 1/1981 | European Pat. Off. . |
| 2412169 | 7/1979 | France . |
| 56-150863 | 11/1981 | Japan .............................. 357/39 LA |

OTHER PUBLICATIONS

D. L. Bergeron, "Isolated High Voltage PNPN Diode and SCR Cells", *IBM Technical Disclosure Bulletin*, vol. 24, No. 9 (Feb. 1982), pp. 4658-4659.
"The Amplifying Gate Thyristor," International Electron Devices Meeting, p. 110 (IEEE, 1968).

*Primary Examiner*—Joseph E. Clawson, Jr.
*Attorney, Agent, or Firm*—Spencer & Frank

[57] ABSTRACT

The invention relates to a controllable semiconductor circuit element consisting of a vertical thyristor comprised of four zones of alternating conductivity types and arranged in a semiconductor disk, with the two load current connections located on the top surface and on the bottom surface of the semiconductor disk respectively. According to the invention, the semiconductor disk comprises an additional controllable circuit element with a lateral zone structure on the top surface of the semiconductor disk. Zones of this additional circuit element are linked with zones of the vertical thyristor in such a way as to enable the vertical thyristor to be indirectly ignited by ignition of the lateral circuit element.

14 Claims, 2 Drawing Figures

LIGHT CONTROLLED TRIAC WITH LATERAL THYRISTOR FIRING COMPLEMENTARY MAIN THYRISTOR SECTION

BACKGROUND OF THE INVENTION

Integrated semiconductor arrangements comprised of a semiconductor disk containing a thyristor and, in addition, an ignition or pilot thyristor in a monolythically integrated form are known. The actual vertical thyristor has a zone sequence npnp of pnpn, with the individual zones arranged sequentially in a vertical direction in the semiconductor disk. The pilot thyristor serving for the ignition likewise has a vertical zone sequence in the known arrangement (F. E. Gentry, J. Moyson: "The Amplifying Gate Thyristor", International Electron Devices Meeting, Washington, D.C. 1968, Technical Digest page 110).

There are cases where the vertical zone sequence of the pilot thyristor is disadvantageous for the ignition of the vertical thyristor. This is, for instance, the case if the pilot thyristor is an optically controlled component where only a small part of the incident light can be used for the switching operation. In other cases, it is desirable to ignite a thyristor from the surface side located opposite the control base zone, which is only possible with the known arrangement if disadvantages are tolerated.

SUMMARY OF THE INVENTION

The object underlying the invention is therefore to provide a controllable semiconductor circuit element comprised of a vertical thyristor and an additional switching element, with which, also in such cases, low electrical or optical triggering outputs are obtainable.

This object is characterized in accordance with the invention in that the additional controllable circuit element has a lateral zone structure and is located at the top surface of the semiconductor disk, and in that zones of this additional circuit element are linked with zones of the vertical thyristor in such a way as to enable the vertical thyristor to be indirectly ignited by ignition of the lateral circuit element.

In a preferred embodiment of the invention, two vertically arranged anti-parallel thyristors each consisting of four zones of alternating conductance type are arranged in the semiconductor disk, with three zones being common to both thyristors, while the fourth outer zones acting as emitters are inserted opposite each other in the top surface and bottom surface of the semiconductor disk in the respective adjoining control base zone. The two load current connections are common to both vertical thyristors. With this arrangement, the vertical thyristor, whose control base zone is located on the surface side of the semiconductor disk facing away from the incident light, can be ignited with low triggering output indirectly by optical ignition of the lateral thyristor, which, in turn, actuates the subsequent ignition of the vertical thyristor.

Further advantageous features of the invention are likewise described.

Bidirectional thyristors designed as vertically switching anti-parallel thyristors and provided with an electric control connection, with both partial thyristors being switchable by trigger currents in this control connection, are already known.

With these switching elements, however, a relatively large electric trigger output is required, in particular, for the ignition of the partial thyristor whose $n^+$-emitter zone and control base zone are not located on the same surface as the control connection (German Auslegeschrift 1,764,821).

If such components are to be ignited by optical irradiation, the partial thyristor whose $n^+$-emitter zone is located on the surface side of the semiconductor body common to both partial thyristors opposite the irradiation direction, may only be ignited by means of relatively high light intensity, unless bad spurious ignition characteristics (du/dt load resistance) are tolerated. With the semiconductor circuit element according to the invention, on the other hand, in the case of optical ignition, at least one of the vertical thyristors is indirectly ignited by the optically controllable lateral thyristor.

Laterally acting thyristors for low triggering output where the spurious ignition resistance is improved by additional aids (German Auslegeschrift 1,464,984) are also known.

Since output components are soldered or glued at least on one side onto a good heat conducting carrier to improve heat dissipation, measures for improving the spurious ignition resistance may only be taken, in vertically arranged bidirectional thyristors, for the partial thyristor whose control base zone is located on the surface side of the semiconductor body which is not soldered to the heat conducting carrier. Such anti-parallel vertical thyristors therefore cannot be triggered by low electrical or optical control outputs.

BRIEF DESCRIPTION OF THE DRAWINGS

The invention is described in greater detail with reference to embodiments shown schematically in the drawings.

DESCRIPTION OF THE PREFERRED EMBODIMENTS

Figure 1:
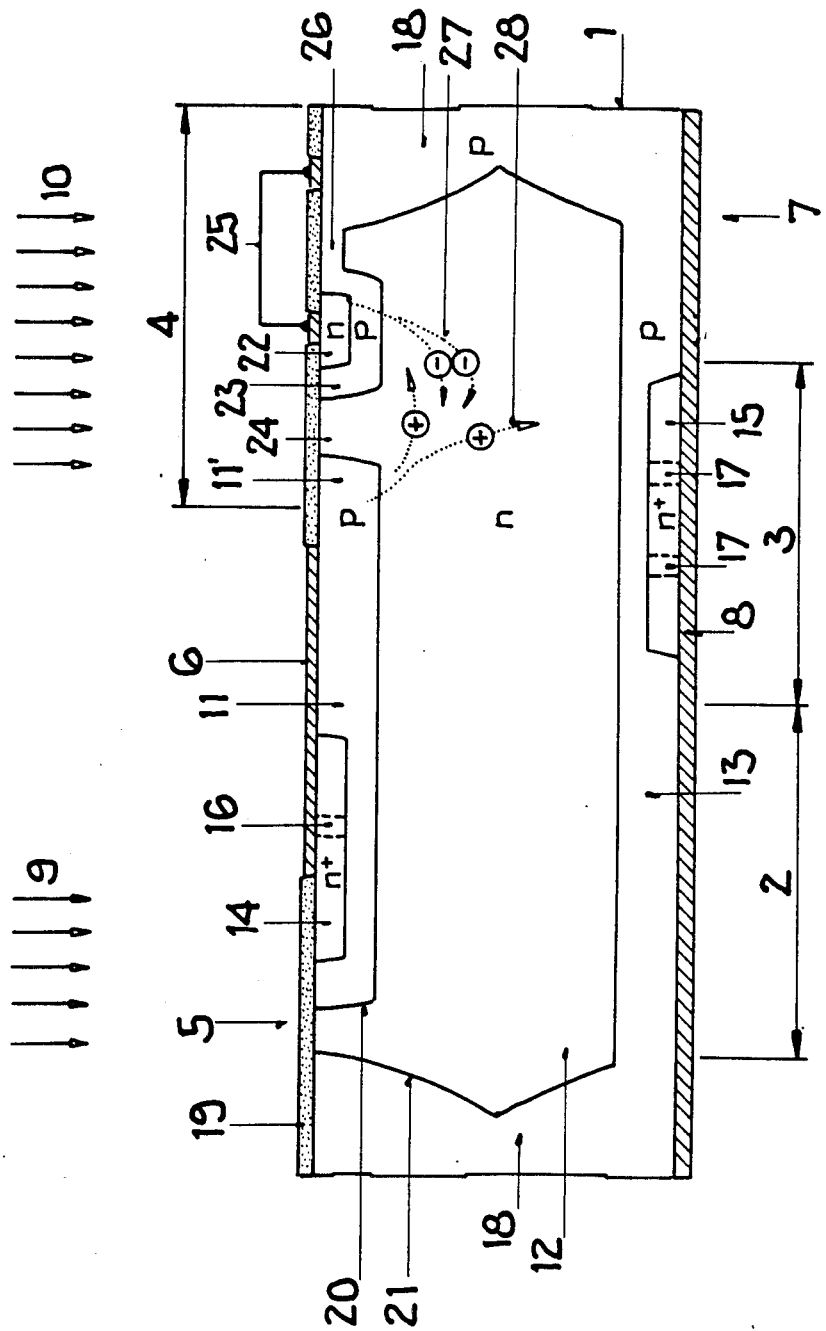
FIG. 1 is a first embodiment of the invention comprised of two anti-parallel vertical thyristors and a lateral thyristor, with the latter being optically ignitable and thereby actuating the ignition of a vertical thyristor.

FIG. 1 is a schematic illustration of a semiconductor disk 1 comprising optically controllable, integrated, anti-parallel vertical thyristors 2 and 3 and a lateral thyristor 4. The top disk surface 5 on which the lateral thyristor is arranged carries one load current connection 6, and the opposite bottom disk surface 7 carries the other load current connection 8. To trigger the element, there are directed at the surface 5, as indicated by arrows, an optical irradiation 9 into the vertical thyristor 3 and an irradiation 10 into the lateral thyristor 4.

The vertical thyristors 2 and 3 have the p zone 11 on the surface side 5, the lower p zone 13 on the opposite surface side 7 of the semiconductor body, and the n conducting base zone 12 located between the p zones 11 and 13 in common. The $n^+$ emitter zone 14 for the thyristor 2 is inserted in the p zone 11, and the $n^+$ emitter zone 15 for the thyristor 3 in the p zone 13. Emitter zones 14 and 15 are linked by shunts 16 and 17 respectively to their respective adjacent p conducting control base zones 11 and 13. These shunts 16 and 17 consist of p conducting, local breakthroughs of the control base zones 11 and 13 respectively, which extend through the adjacent emitter zones 14 and 15 respectively as far as the respective surfaces 5 and 7. These shunts 16 and 17 reduce the spurious ignition sensitivity.

The p zone 13 extends from the bottom side 7 of the semi-conductor disk 1 through a separating diffusion zone 18 to the surface side 5 where it is insulated against the upper p zone 11 by the pn junctions 20, 21 covered by oxide layers or semi-insulating layers 19.

The lateral thyristor 4 on the surface side 5 consists of the n+ emitter zone 22, its surrounding, associated and p conducting control base zone 23, and n base area 24 reaching the surface 5, and the laterally adjacent p conducting zone area 11' which forms the p emitter and is comprised of a section of the p conducting zone 11 of the vertical thyristors 2 and 3. The p conducting zone areas 11 and 11' therefore extend into one another and the overlapping area constitutes a bulk resistance. The n+ emitter zone 22 is connected to the upwardly extending, p conducting separating diffusion zone 18 via an Ohmic link 25. Furthermore, the p control base zone 23 is connected to the separating diffusion zone 18 by a slightly p doped area 26, which constitutes the resistance determining the ignition and spurious ignition sensitivity of the lateral thyristor 4.

While the thyristor 2 is ignited in the known manner by optical irradiation 9 and the charge carrier generation caused thereby in the p zone 11 and the pn junction 20 constituted by zones 11 and 12, ignition of the thyristor 3 is effected indirectly by optical ignition of the lateral thyristor 4. Thyristor 3 is not ignited until the load current in the thyristor 4 causes a strong injection of holes from the p emitter zone 11' into the n base area 24 and 12, respectively, as indicated by the electron flows 27 and the hole flows 28 in FIG. 1. The advantage gained by the invention consists in that the partial thyristor 3, whose optical ignition sensitivity is low, is indirectly triggered by the substantially more ignition sensitive element 4. Thus, the otherwise high ignition sensitivity required of the thyristor 3 with the disadvantageous correspondingly high spurious ignition sensitivity is avoided.

Figure 2:
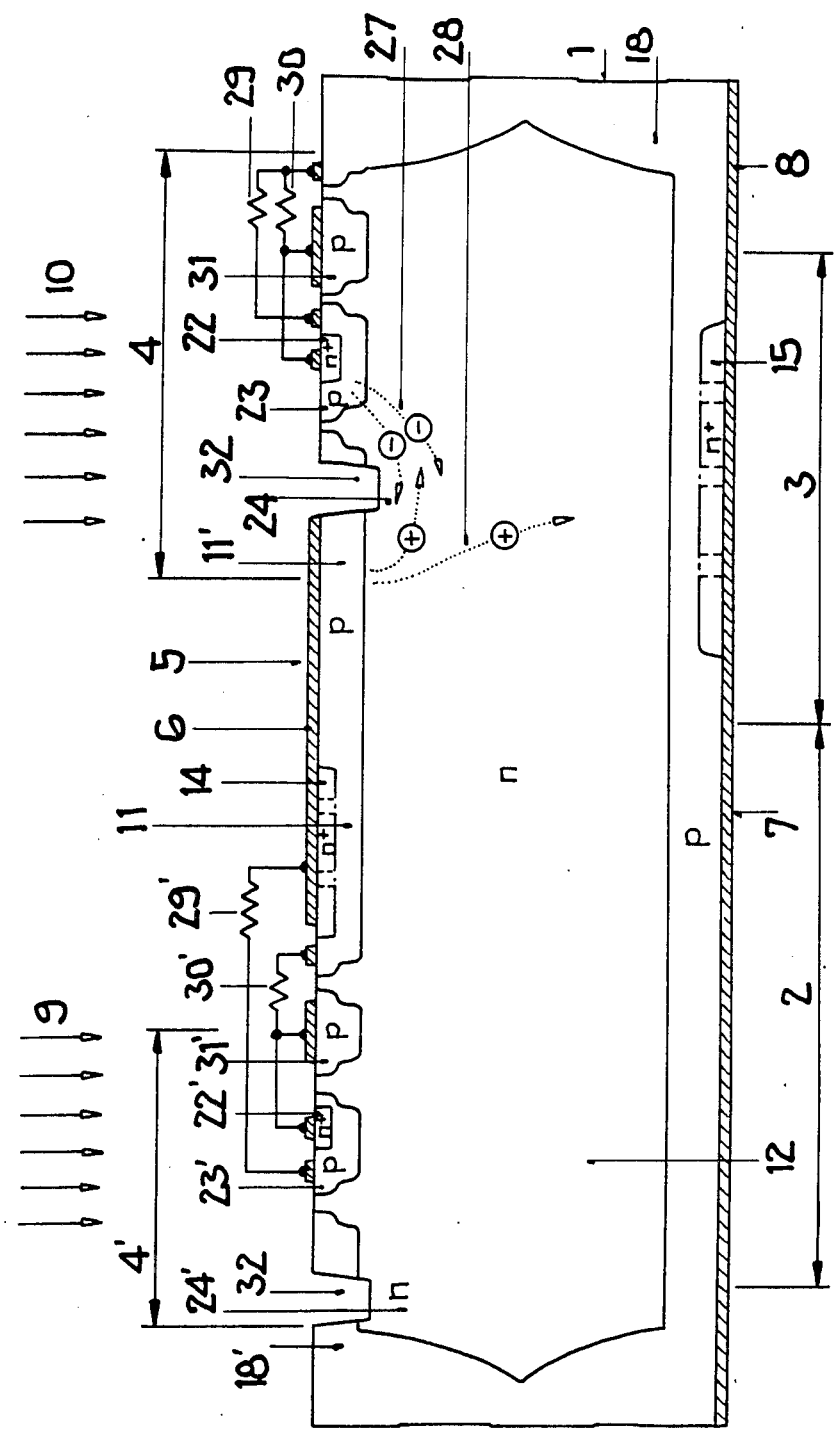
FIG. 2 is a further embodiment wherein additional measures are taken for the prevention of spurious ignitions.

FIG. 2 shows an advantageous further development of the invention where a lateral thyristor 4' is also associated with the vertical thyristor 2 for ignition purposes. The lateral thyristors 4 and 4' also have additional circuit components for avoidance of spurious ignitions, i.e., a du/dt compensation. The design of the du/dt compensated lateral thyristors is identical. They consist of the n+ emitter zones 22, 22', the control base zones 23, 23', the control base leak resistors 29, 29' which carry out a similar function to that of the p zone 26 in FIG. 1, the emitter preresistors 30, 30' and the compensation zones 31, 31', and finally the n base areas 24, 24', and the p emitter areas 11' and 18'. The emitter preresistors 30, 30' and the control base leak resistors 29, 29' are dimensioned such that with du/dt loads—i.e. with steeply rising inverse voltage jumps—the capacitive spurious currents cause identically sized voltages at resistors 29, 30 and 29' and 30', respectively, so that a current flow through the pn junctions between zones 22 and 23, and 22' and 23', respectively, is avoided, thus safely preventing the occurrence of a spurious ignition. The capacitive currents through resistors 29, 29' occur in the presence of voltage on account of the pn junctions between zones 23 and 12 and 23' and 12', respectively; the capacitive currents through resistors 30, 30' on account of the pn junctions between the zones 31, 12 and 31', 12', respectively.

The p zone areas 23, 23' and, advantageously, also the base zone areas 24 and 24' are subjected to irradiation to effect optical ignition. In this case, the voltage decrease caused by the photo-electric current at the control base leak resistor 29, 29' initiates ignition. The compensation areas 31 and 31' are protected from irradiation by covers.

This embodiment permits an increase in the optical triggering sensitivity without raising the spurious ignition sensitivity of the partial thyristors.

Base zone 11 is separated from base zone 13 by passivation trenches 32 so that greater stability may also be achieved in the case of larger inverse voltages. These, for instance, etched passivation trenches 32 are always located in the region of the base zone areas 24 and 24' of the lateral thyristors.

Basically, the advantage of the invention is not limited to optical triggering. Also in the case of triggering by means of small control currents, the integration of a lateral thyristor 4 is of advantage; it will, however, in this event be designed accordingly as an electrically ignited thyristor.

Furthermore, an embodiment is possible where the entire circuit component is provided with interchanged conductivity dopings, i.e., where the p zones are replaced by n zones (and vice versa). The emitter zones and the control base zones are preferably produced by means of diffusion.

The arrangement shown in FIG. 2 has the advantage that the lateral thyristor 4 which is associated with the vertical thyristor 3 and ignites it may comprise integrated protective circuit components. Such a direct protective circuitry is hardly or only incompletely realizable for the vertical thyristor 3, since its large-surface cathode metallization in the form of the load current connection 8 is mounted on a good heat conducting carrier body, so that these bottom surfaces of the semiconductor disk 1 are practically not available for accommodation and contacting of further circuitry elements.

What is claimed is:

1. In a controllable semiconductor circuit element including: first and second antiparallel vertical thyristors arranged in a semiconductor wafer, with each of said vertical thyristors being composed of four successive zones of alternating conductivity type, and with three of said zones being common to both said thyristors while the respective fourth, outer zones, which act as emitters, of said first and second vertical thyristors are provided in the upper surface and in the lower surface respectively of said semiconductor wafer within the respectively adjacent control base zone; first and second load current terminals, which are common to both said vertical thyristors, disposed on said upper and lower surfaces, respectively; and a further controllable lateral switching means integrated in said semiconductor wafer for firing said second vertical thyristor; the improvement wherein said lateral switching means is a first lateral thyristor having four successive zones of alternating conductivity type extending along said upper surface with one outer zone of said lateral thyristor being coupled electrically to the one of said three zones common to both said vertical thyristors which is of the same conductivity type and is disposed at the said upper surface of said semiconductor wafer, and with the other outer zone of said lateral thyristor being coupled electrically with the one of said three zones common to both said vertical thyristors which is of the opposite conductivity type and is disposed at said lower surface of semiconductor wafer; and further comprising a further lateral thyristor coupled to said first vertical thyristor for initiating the ignition of same and with the lateral zone sequence of said further lateral thyristor extending along said upper surface of said semiconductor wafer.

2. A controllable semiconductor circuit element according to claim 1 wherein said one outer zone of said first lateral thyristor at least partly overlaps the projection of the emitter zone of the vertical thyristor whose emitter zone is located at said bottom surface of said semiconductor wafer.

3. A controllable semiconductor circuit element according to claim 1, wherein said first lateral thyristor surface is optically switchable.

4. A controllable semiconductor circuit element according to claim 1 wherein said one of said three zones located at said bottom surface extends along the edge of said semiconductor wafer to said upper surface where it is electrically connected to said other outer zone of said first lateral thyristor via an electrical ohmic connection or an applied metallization.

5. A controllable semiconductor circuit element according to claim 4, wherein the zone of said first lateral thyristor surrounding said other outer zone of said first lateral thyristor is ohmically connected at said upper surface with said zone extending along the edge of said wafer from said bottom surface via a resistive region of the same conductivity type extending along said upper surface.

6. A controllable semiconductor circuit element according to claim 1, wherein said one outer zone of said first lateral thyristor extends via a zone area of the same conductivity type acting as bulk resistance into said one of said three zones common to both of said vertical thyristors disposed at said upper surface of said semiconductor wafer.

7. A controllable semiconductor circuit element according to claim 1, further comprising a circuit means connected to each of said lateral thyristors for the prevention of spurious ignitions.

8. A controllable semiconductor circuit element according to claim 3 wherein said first vertical thyristor is likewise optically switchable.

9. A controllable semiconductor circuit element according to claim 1 wherein both of said lateral thyristors are optically switchable.

10. A controllable circuit element composed of two antiparallel vertical thyristors and two lateral thyristors for firing said vertical thyristors, said circuit element comprising in combination: a semiconductor wafer including first, second, third and fourth successive zones of alternating conductivity types disposed between opposite first and second major surfaces of said semiconductor wafer, said first zone extending along said first major surface and along the edges of said wafer to said second major surface, and each of said second, third and fourth zones extending to said first major surface with said third zone being completely surrounded by said second zone and said fourth, which comprises the emitter zone of one of the vertical thyristors, being completely surrounded by said second zone at said second major surface; a fifth zone, which is of one conductivity type, and constitutes the emitter zone of the other vertical thyristor, extending to said first major surface and completely surrounded by said first zone, which is of the opposite conductivity type, at said first major surface; a first load current terminal for both of said vertical thyristors ohmically contacting said first and fifth zones at said first major surface; a second load current terminal for both of said vertical thyristors ohmically contacting said third and fourth zones at said second major surface; a sixth zone of said opposite conductivity type formed in said second zone at said second major surface adjacent but laterally spaced from said third zone; a seventh zone of said one conductivity type, and constituting the emitter of a lateral thyristor, formed completely within said sixth zone at said second major surface, thereby providing a first lateral thyristor including said seventh zone, said sixth zone, the adjacent portion of said third zone, said sixth zone, the adjacent portion of said third zone and the intermediate portion of said second zone; means for ohmically connecting said seventh zone to said first zone at said second major surface; a further lateral thyristor formed in said semiconductor wafer adjacent said second major surface for firing the other of said vertical thyristors, said further lateral thyristor including an eighth zone of said opposite conductivity type formed in and surrounded by said second zone at said second major surface with said eighth zone being adjacent but laterally spaced from said first zone at said second major surface, and a ninth zone of said one conductivity type formed in and surrounded by said eighth zone at said second major surface; and means for ohmically connecting said ninth zone to said third zone.

11. A controllable semiconductor circuit element as defined in claim 10 further comprising resistance means for ohmically connecting said sixth zone to said first zone at said second major surface.

12. A controllable semiconductor circuit element as defined in claim 11 wherein said resistance means comprises a region of said opposite conductivity type extending along said second major surface from said sixth zone to said first zone.

13. A controllable semiconductor circuit element as defined in claim 10 wherein said first lateral thyristor and the vertical thyristor including said fourth zone are optically switchable.

14. A controllable semiconductor circuit element as defined in claim 10 wherein both of said lateral thyristors are optically switchable.

* * * * *